(12) United States Patent
Yamauchi et al.

(10) Patent No.: US 11,380,599 B2
(45) Date of Patent: Jul. 5, 2022

(54) SEMICONDUCTOR MODULE, VEHICLE, AND METHOD OF MANUFACTURING SEMICONDUCTOR MODULE

(71) Applicant: FUJI ELECTRIC CO., LTD., Kanagawa (JP)

(72) Inventors: Kohei Yamauchi, Matsumoto (JP); Tatsuhiko Asai, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 30 days.

(21) Appl. No.: 16/799,679

(22) Filed: Feb. 24, 2020

(65) Prior Publication Data

US 2020/0402880 A1 Dec. 24, 2020

(30) Foreign Application Priority Data

Jun. 24, 2019 (JP) .............................. JP2019-116218

(51) Int. Cl.
| | |
|---|---|
| *H01L 21/00* | (2006.01) |
| *H01L 23/28* | (2006.01) |
| *H01L 23/31* | (2006.01) |
| *H05K 1/11* | (2006.01) |
| *H01L 23/538* | (2006.01) |
| *H01L 21/56* | (2006.01) |

(52) U.S. Cl.
CPC .......... *H01L 23/3142* (2013.01); *H01L 21/56* (2013.01); *H01L 23/5386* (2013.01); *H05K 1/11* (2013.01)

(58) Field of Classification Search
CPC ............. H01L 23/3135; H01L 23/3142; H01L 23/5386

USPC .................. 257/675, 706, 796; 438/121–127
See application file for complete search history.

(56) References Cited

U.S. PATENT DOCUMENTS

| | | | | |
|---|---|---|---|---|
| 5,055,914 A | * | 10/1991 | Shimizu ................. | H01L 23/04 257/722 |
| 5,293,301 A | * | 3/1994 | Tanaka ................ | H01L 23/4334 |
| 7,145,254 B2 | * | 12/2006 | Hirano .................... | H01L 24/32 257/796 |
| 7,323,769 B2 | * | 1/2008 | Tan ...................... | H01L 23/3107 257/684 |
| 7,928,538 B2 | * | 4/2011 | Salzman .............. | H05K 9/0039 257/659 |
| 8,164,182 B2 | * | 4/2012 | Ong .................... | H01L 23/3677 257/707 |
| 8,497,156 B2 | * | 7/2013 | Moriya ................... | H01L 23/29 438/106 |
| 8,860,190 B2 | * | 10/2014 | Yamada ............ | H01L 23/49805 257/659 |
| 10,026,701 B1 | * | 7/2018 | Rodenbeck ........... | H01L 23/552 |

(Continued)

FOREIGN PATENT DOCUMENTS

| | | |
|---|---|---|
| JP | S61147555 A | 7/1986 |
| JP | 2008270455 A | 11/2008 |

(Continued)

*Primary Examiner* — Calvin Lee

(57) ABSTRACT

There is provided a semiconductor module including: a base for semiconductor cooling; a stacked substrate provided above the base; a semiconductor chip provided above the stacked substrate; a coating layer provided on an upper surface of the semiconductor chip; and a sealing resin for sealing the semiconductor chip, in which the base is in contact with the sealing resin.

13 Claims, 14 Drawing Sheets

(56) References Cited

U.S. PATENT DOCUMENTS

| | | | |
|---|---|---|---|
| 10,074,799 B2 * | 9/2018 | Jang | H01L 23/3128 |
| 10,720,373 B2 * | 7/2020 | Salamone | H01L 23/3114 |
| 10,978,418 B2 * | 4/2021 | Mahler | H01L 24/03 |
| 2008/0258316 A1 | 10/2008 | Tamba | |
| 2015/0171026 A1 | 6/2015 | Terai | |

FOREIGN PATENT DOCUMENTS

| | | |
|---|---|---|
| JP | 2011171395 A | 9/2011 |
| JP | 2013149913 A | 8/2013 |
| WO | 2014009996 A1 | 1/2014 |

\* cited by examiner

A—A'

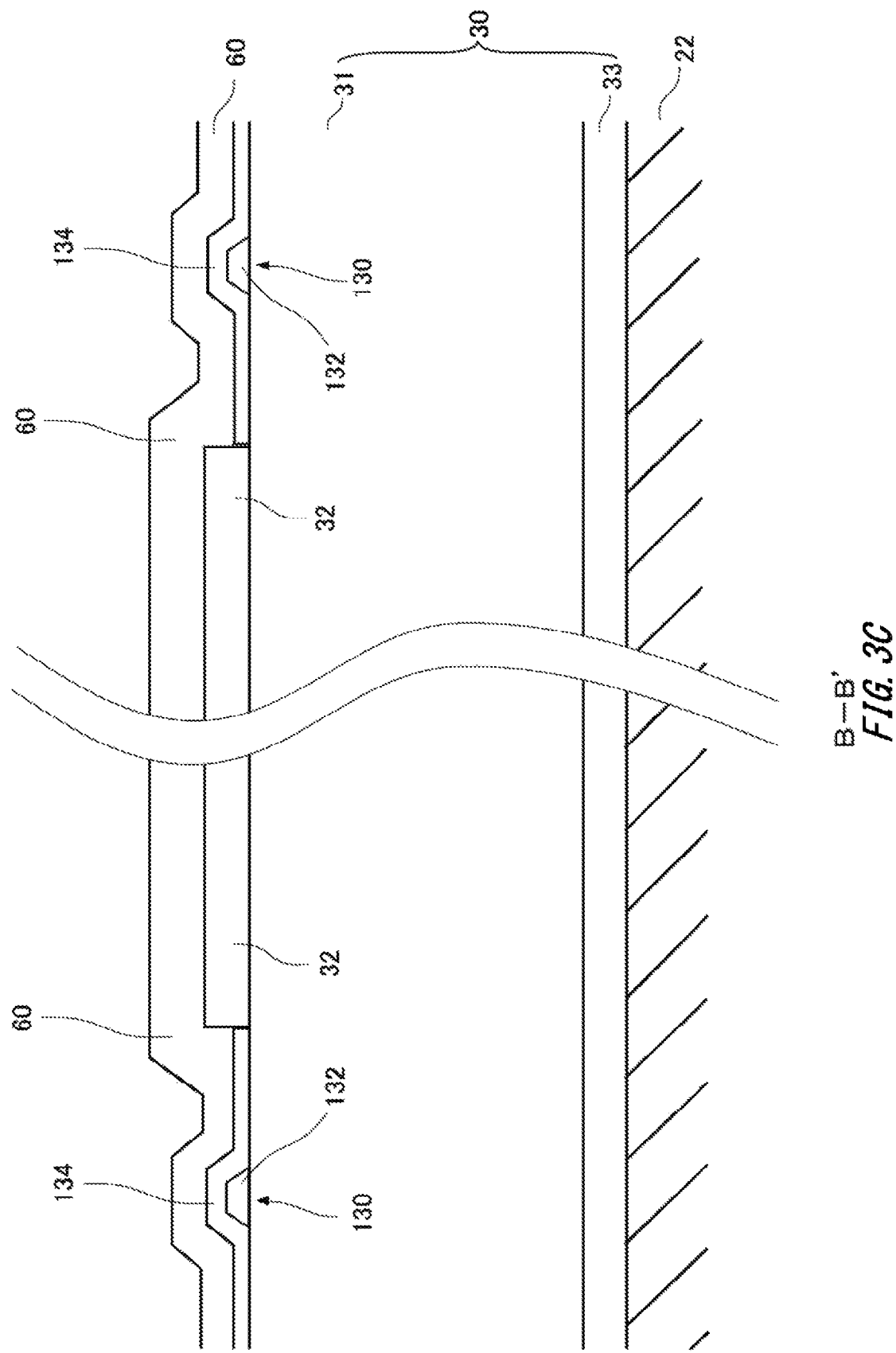
B-B' FIG. 3C

SEMICONDUCTOR MODULE, VEHICLE, AND METHOD OF MANUFACTURING SEMICONDUCTOR MODULE

The contents of the following Japanese patent application(s) are incorporated herein by reference:
NO. 2019-116218 filed in JP on Jun. 24, 2019.

BACKGROUND

1. Technical Field

The present invention relates to a semiconductor module, a vehicle, and a method of manufacturing a semiconductor module.

2. Related Art

In the related art, in order to increase an adhesion between a sealing resin and a semiconductor cooler, a polyimide resin has been applied to a whole surface of a semiconductor module (see, for example, PTL 1).

CITATION LIST

Patent Literature

[PTL 1] Japanese Unexamined Patent Application Publication No. S61-147555 (JP-S61-147555A)

SUMMARY

With respect to a semiconductor module, a coating layer, which is provided between a sealing resin of an element and a metal portion of a semiconductor module, is selectively applied so as to reduce a cost.

In order to solve the above problem, a first aspect of the present invention provides a semiconductor module. A semiconductor module includes a base for semiconductor cooling; a stacked substrate provided above the base; a semiconductor chip provided above the stacked substrate; a coating layer provided on an upper surface of the semiconductor chip; and a sealing resin for sealing the semiconductor chip. The base may be in contact with the sealing resin.

The coating layer may be provided on at least a part of an upper surface of the stacked substrate.

The semiconductor chip may have an upper main electrode of the semiconductor chip. The coating layer may be provided in contact with an upper surface of the upper main electrode.

The coating layer may include at least one of polyimide or polyamide.

The semiconductor chip may have a passivation film provided on the upper surface of the semiconductor chip. The passivation film may include polyimide. The coating layer may be provided on an upper surface of the passivation film.

The semiconductor module may further include a printed circuit board (PCB) provided above the semiconductor chip. The coating layer may be provided on an upper surface of the PCB.

The coating layer may be provided on an upper surface of the base below the PCB, in a top plan view. The sealing resin may be implanted between the coating layer immediately below the PCB and a lower surface of the PCB.

The semiconductor module may further include a housing that surrounds a whole side surface of the sealing resin. The PCB may have a connection pad for connecting the semiconductor chip to the PCB on the upper surface. The connection pad may be provided apart from the housing. The coating layer may be provided on an upper surface of the connection pad.

The semiconductor module may further include a metal wiring plate provided on the upper surface of the semiconductor chip. The coating layer may be provided on the upper surface of the semiconductor chip, and at least one of an upper surface and a lower surface of the metal wiring plate.

The coating layer may be provided on the lower surface of the metal wiring plate rather than on the upper surface of the metal wiring plate.

The coating layer may be provided on the upper surface of the metal wiring plate rather than on the lower surface of the metal wiring plate.

A second aspect of the present invention provides a vehicle including the semiconductor module.

A third aspect of the present invention provides a method of manufacturing a semiconductor module. A method of manufacturing a semiconductor module includes: providing a base for semiconductor cooling; providing a stacked substrate above the base; providing a semiconductor chip above the stacked substrate; providing a coating layer on an upper surface of the semiconductor chip; and sealing the semiconductor chip with a sealing resin. The base may be in contact with the sealing resin.

The providing of the coating layer may include applying the coating layer by spray application.

The summary clause does not necessarily describe all necessary features of the embodiments of the present invention. The present invention may also be a sub-combination of the features described above.

BRIEF DESCRIPTION OF THE DRAWINGS

FIG. 3C is an example of a cross-sectional view of a semiconductor chip 30.

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means for solving in the invention.

In this specification, one side in a direction parallel to a depth direction of a semiconductor module is referred to as "upper side", and the other side is referred to as "lower side". Of two principal surfaces of a substrate, a layer or another member, one surface is referred to as an upper surface and the other surface is referred to as a lower surface. An "upper" and "lower" directions are not limited to a direction of gravity, or an attachment direction to a substrate or the like when a semiconductor chip is mounted.

Figure 1A:
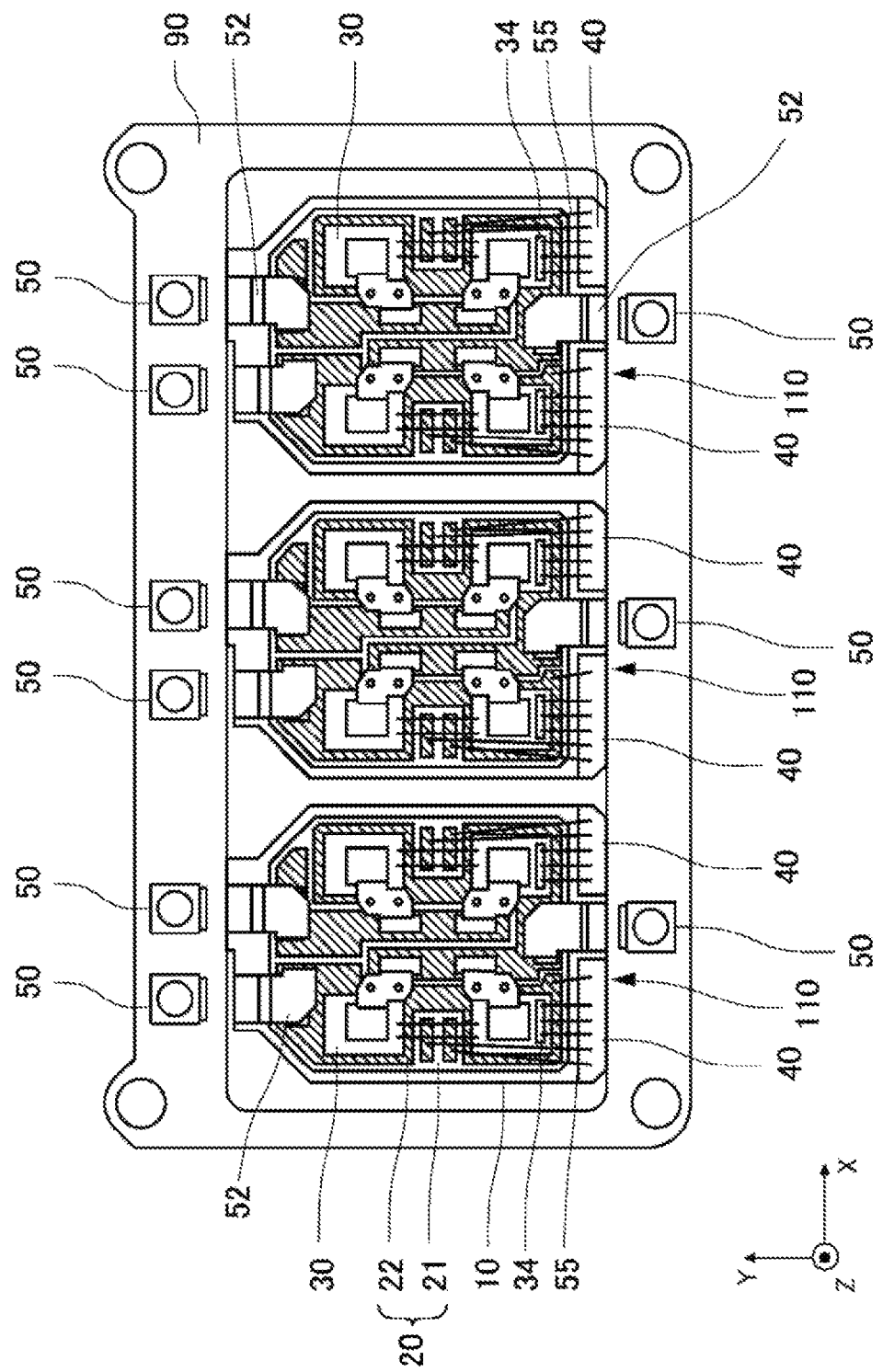
FIG. 1A is an example of a top plan view of a semiconductor module 100.

FIG. 1A is an example of a top plan view of a semiconductor module 100. A semiconductor module 100 includes a base 10, a stacked substrate 20 provided above the base 10, a semiconductor assembly 110 having a semiconductor chip 30 provided above the stacked substrate 20, and a PCB (Print Circuit Board; Printed Circuit Board) 40 provided above the semiconductor assembly 110, and a housing 90 provided to surround a side edge portion of the base 10.

In this specification, a long side direction of the rectangular housing 90 in a top plan view of FIG. 1A is set to be an X-axis, and a short side direction is set to be a Y-axis. Further, a direction, which forms a right-handed system with respect to an X-axis direction and a Y-axis direction and which is a direction of a side where the semiconductor assembly 110 is provided in the semiconductor module 100, is set to be a Z-axis direction. Further, the top plan view refers to a direction as the direction of the semiconductor module 100 is viewed from a positive direction of a Z-axis.

The housing 90 is provided to surround a plurality of semiconductor assemblies 110 on an outer edge portion of the base 10. The housing 90 is provided by using polyphenyl sulfide (PPS), polybutylene terephthalate (PBT), polybutyl acrylate (PBA), polyamide (PA), acrylonitrile butadiene styrene (ABS), liquid crystal polymer (LCP), polyether ether ketone (PEEK), Polybutylene succinate (PBS), urethane and silicone, or the like. In this example, the housing 90 is provided by using a PPS resin which is a heat-resistant resin.

The base 10 is a base for semiconductor cooling to dissipate heat generated in the semiconductor assembly 110. The base 10 is provided by using metal with an excellent thermal conductivity. As an example, the base 10 is provided by using the metal such as copper, aluminum, iron, or an alloy thereof.

A cooler is provided below the base 10. As an example, the cooler includes a heat sink having a plurality of fins. Furthermore, the cooler may be a liquid-cooling type cooling apparatus which makes a cooling effect by a cooling liquid flowing among the plurality of fins. As an example, the cooler is provided by using the metal such as copper, aluminum, iron, or an alloy thereof.

As an example, a joint layer including a thermal compound is provided between the cooler and the base 10. The joint layer may be provided by using organic oil including a filler with a good thermal conductivity such as alumina. In another example, the cooler and the base 10 may be integrally formed by the metal. In this case, the base 10 becomes an upper surface of the cooler.

The stacked substrate 20 may be a DCB (Direct Copper Bonding) substrate, an AMB (Active Metal Blazed) substrate, or the like. The stacked substrate 20 in this example is the DCB substrate.

The stacked substrate 20 has a structure in which each metal plate 22 is directly joined to an insulation plate 21 such that the insulation plate 21 is interposed in the up-down direction. The stacked substrate 20 may be provided above the base 10 via a joining material by solder joining using lead-free solder.

The insulation plate 21 includes a material with a high thermal conductivity and a low dielectric loss. As an example, the insulation plate 21 includes a ceramic material such as alumina, aluminum nitride, or silicon nitride. The metal plate 22 is provided by using metal such as copper or aluminum. Particularly, in a case where the stacked substrate 20 is the DCB substrate, the metal plate 22 is provided by using copper or a copper alloy.

As an example, the semiconductor chip 30 has a switching element such as a power MOSFET (Metal Oxide Semiconductor Field Effect Transistor), an insulated gate bipolar transistor (IGBT), and an RC (Reverse Conducting)-IGBT, and a freewheeling diode such as an FWD (Free Wheeling Diode). The semiconductor chip 30 may be manufactured by using a semiconductor substrate 31 of silicon, silicon carbide, gallium nitride, or the like, which is shown in following FIG. 3C. In the semiconductor module 100 including the semiconductor assembly 110 including a plurality of semiconductor chips 30, it is possible to constitute an inverter, or a power device such as an IPM (Intelligent Power Module) including a control circuit, as a whole. The semiconductor chip 30 is provided above the stacked substrate 20, particularly on an upper surface of the metal plate 22. Between the semiconductor chip 30 and the metal plate 22, the solder joining using the lead-free solder as the joining material may be applied, similar to the case between the base 10 and the stacked substrate 20.

The PCB 40 has a wiring layer connected to a control electrode 34 of the switching element of the semiconductor chip 30. As an example, the PCB 40 is electrically connected to the semiconductor chip 30 by a bonding wire 55. As an example, the PCB 40 is provided as a board in which the wiring layer is provided on a polyimide film substrate or an epoxy film substrate. The PCB 40 may be provided on a shelf-shape portion which protrudes to the semiconductor assembly 110 side above the semiconductor chip 30 in a wall surface of the housing 90.

One or more external connection sections 50 are provided around each semiconductor assembly 110. As an example, in a case where the semiconductor module 100 is a three-phase inverter, three external connection sections 50 may be provided for each semiconductor assembly 110 as power source terminals and load terminals to drive a U phase, V phase, and W phase. The external connection section 50 may be subjected to nickel plating. By connecting a copper bus bar to the external connection section 50, it is possible to apply a large current to each main terminal 52 of the semiconductor assembly 110.

The number of main terminals 52 provided corresponds to the number of external connection sections 50 and the main terminals 52 are electrically connected to the external connection sections 50. The main terminal 52 and the external connection section 50 may be connected by welding or the joining material, or may be formed by a single metal plate. The main terminal 52 is provided as a terminal for an external connection in each semiconductor assembly 110 to supply a voltage for driving the element of each semiconductor chip 30.

Figure 1B:
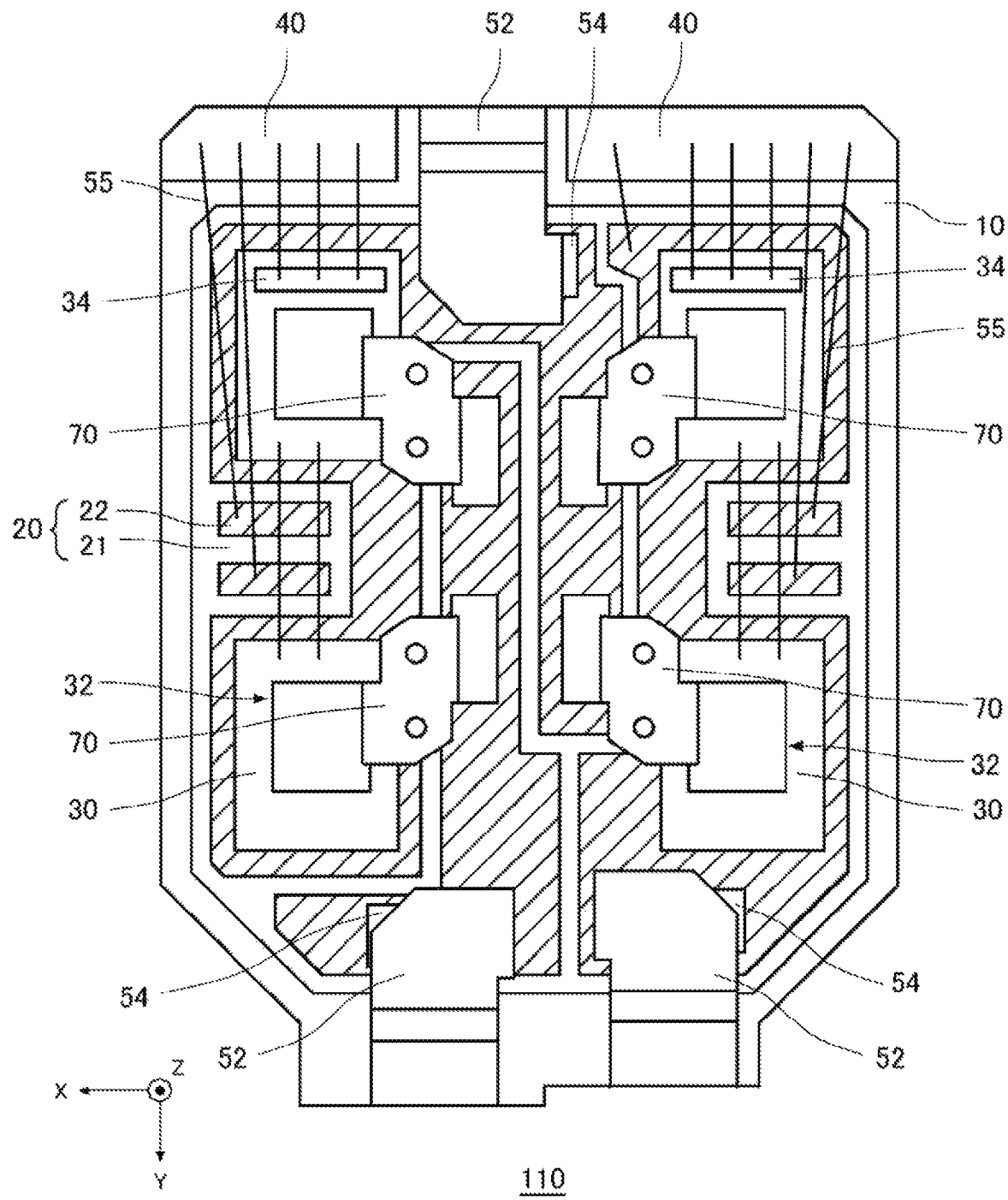
FIG. 1B is an example of a top plan view of a semiconductor assembly 110.

FIG. 1B is a top plan view showing a single semiconductor assembly 110. The semiconductor assembly 110 of this example includes the stacked substrate 20, and two sets of two semiconductor chips 30 of which the total is four and which are mounted on the stacked substrate 20. The semiconductor chip 30 is electrically connected to the main terminal 52 for the external connection. The semiconductor assembly 110 may have a metal wiring plate 70 which electrically connects the semiconductor chip 30 and the main terminal 52. Instead of the metal wiring plate 70, the semiconductor chip 30 and the main terminal 52 may be electrically connected by a conductive member such as a wire or a ribbon. The semiconductor assembly 110 may include a block 54 provided on the metal plate 22. The main terminal 52 may be connected to the metal plate 22 via the block 54, or may be connected to the metal plate 22 by the joining material instead of the block 54. The metal plate 22 may include a main circuit section to which the semiconductor chip 30 and the metal wiring plate 70 are connected, and a control circuit section to which the control electrode 34 is connected.

On an upper surface of the semiconductor chip 30, an upper main electrode 32 for the external connection and the control electrode 34 for controlling a main current are provided. The upper main electrode 32 may include aluminum, nickel, or an alloy including at least one of them. In a case where the semiconductor chip 30 has a vertical switching element, the semiconductor chip 30 may have the upper main electrode 32 on a side of the upper surface and a lower main electrode 33 on an opposite side of the upper main electrode 32, which is shown in following FIG. 3C. In a case where the switching element is an IGBT element, the upper main electrode 32 may be an emitter electrode and the lower main electrode 33 may be a collector electrode. The control electrode 34 may include various sense electrodes such as an emitter sense electrode, a temperature sense electrode, and a current sense electrode, in addition to a gate electrode.

The upper main electrode 32 and the metal plate 22 may be electrically connected by the metal wiring plate 70. The upper main electrode 32 and the metal wiring plate 70 may be joined by the solder joining using the lead-free solder.

As an example, the metal wiring plate 70 is provided by using a material with an excellent conductivity such as aluminum, copper, or an alloy including at least one of them. The metal wiring plate 70 may be provided by using a lead frame. The metal wiring plate 70 may have a proximal end portion connected to the metal plate 22, a distal end portion connected to the upper main electrode 32, and a link section which connects both end portions. Here, "proximal" and "distal" are defined as "proximal" and "distal" as viewed from a positive side in the Z-axis direction of the semiconductor substrate. In a case where the link section is viewed in the Y-axis direction, the link section may be rectangular.

The block 54 is provided on the upper surface of the metal plate 22. The block 54 also functions as a heat dissipation block which diffuses and dissipates heat generated in the semiconductor assembly 110. The block 54 may be provided by using a metal material such as copper and a copper alloy.

The PCB 40 has the wiring layer, and a control terminal (not shown) and the bonding wire 55 are connected to the wiring layer. The semiconductor chip 30 may be controlled by various signals issued from the control circuit via the PCB 40. The semiconductor chip 30 may include the various sense electrodes in addition to the gate electrode, and the sense electrodes may also be connected to the control circuit via the bonding wires 55 and the PCB 40. The current of a control signal may be smaller than the current flowing through the main terminal 52.

The PCB 40 may have a structure of being separated by the main terminal 52 and divided into a plurality of sheets as in this example. In a part between a plurality of PCBs 40, a part of the base 10 may be exposed in the top plan view.

Figure 1C:
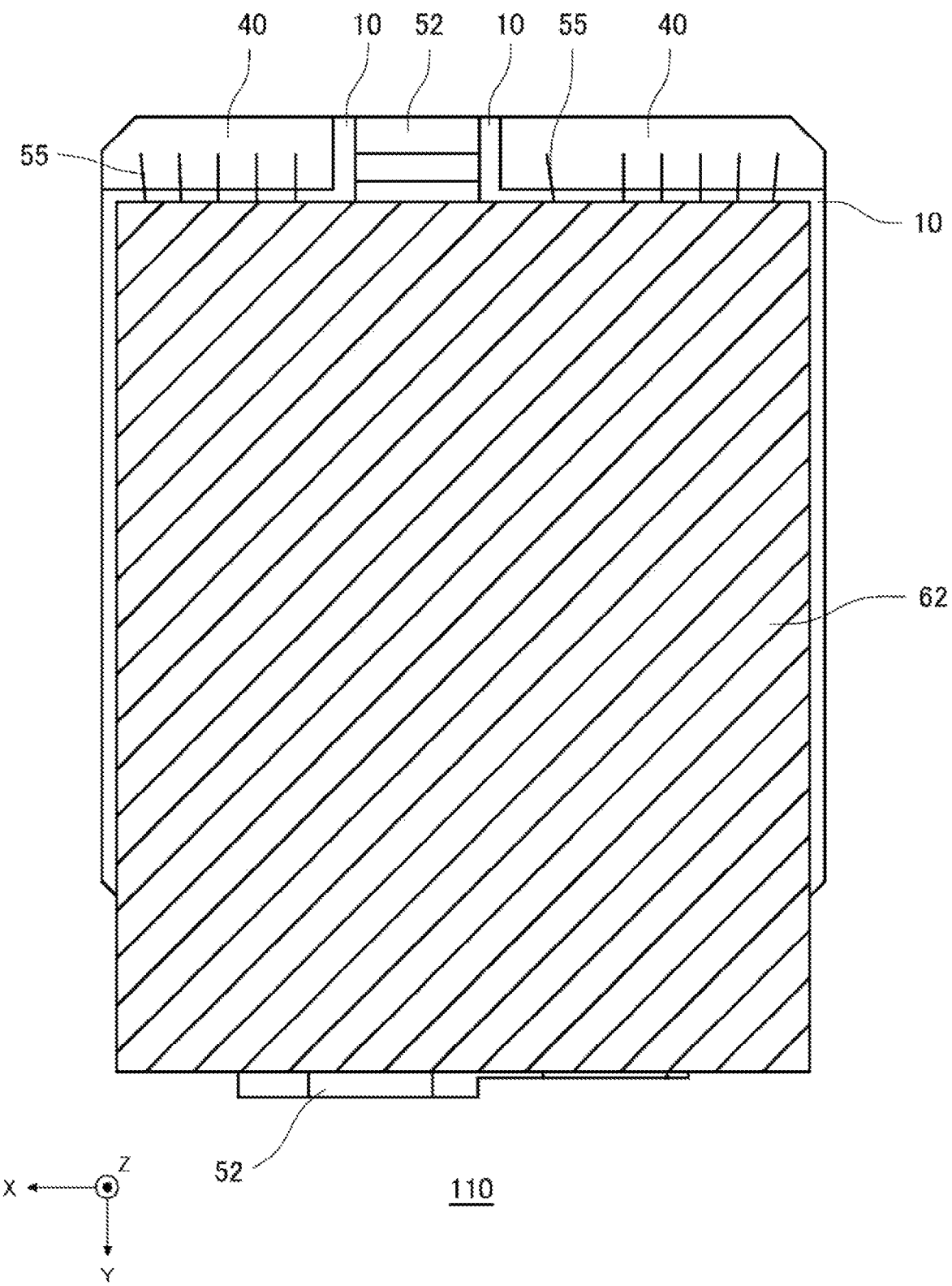
FIG. 1C is an example of a top plan view showing a coating region 62 according to Example 1.

FIG. 1C is an example of a top plan view showing a coating region 62 according to Example 1. The coating region 62 illustrates a region in which a coating layer 60 can be provided in the semiconductor module 100, in the top plan view. The coating layer 60 is disposed above the semiconductor assembly 110.

Figure 3A:
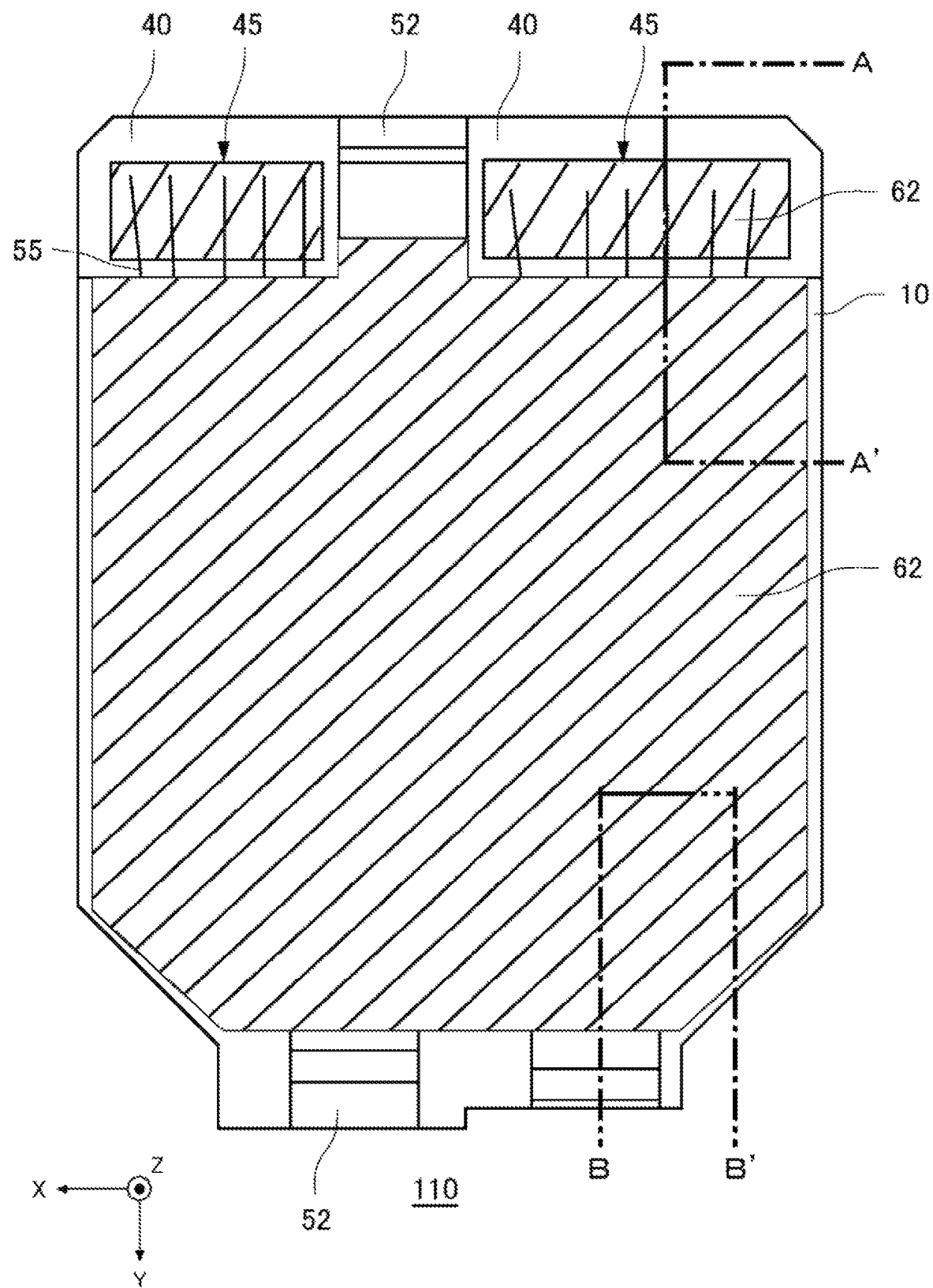
FIG. 3A is an example of a top plan view showing the coating region 62 according to Example 5.
Figure 3B:
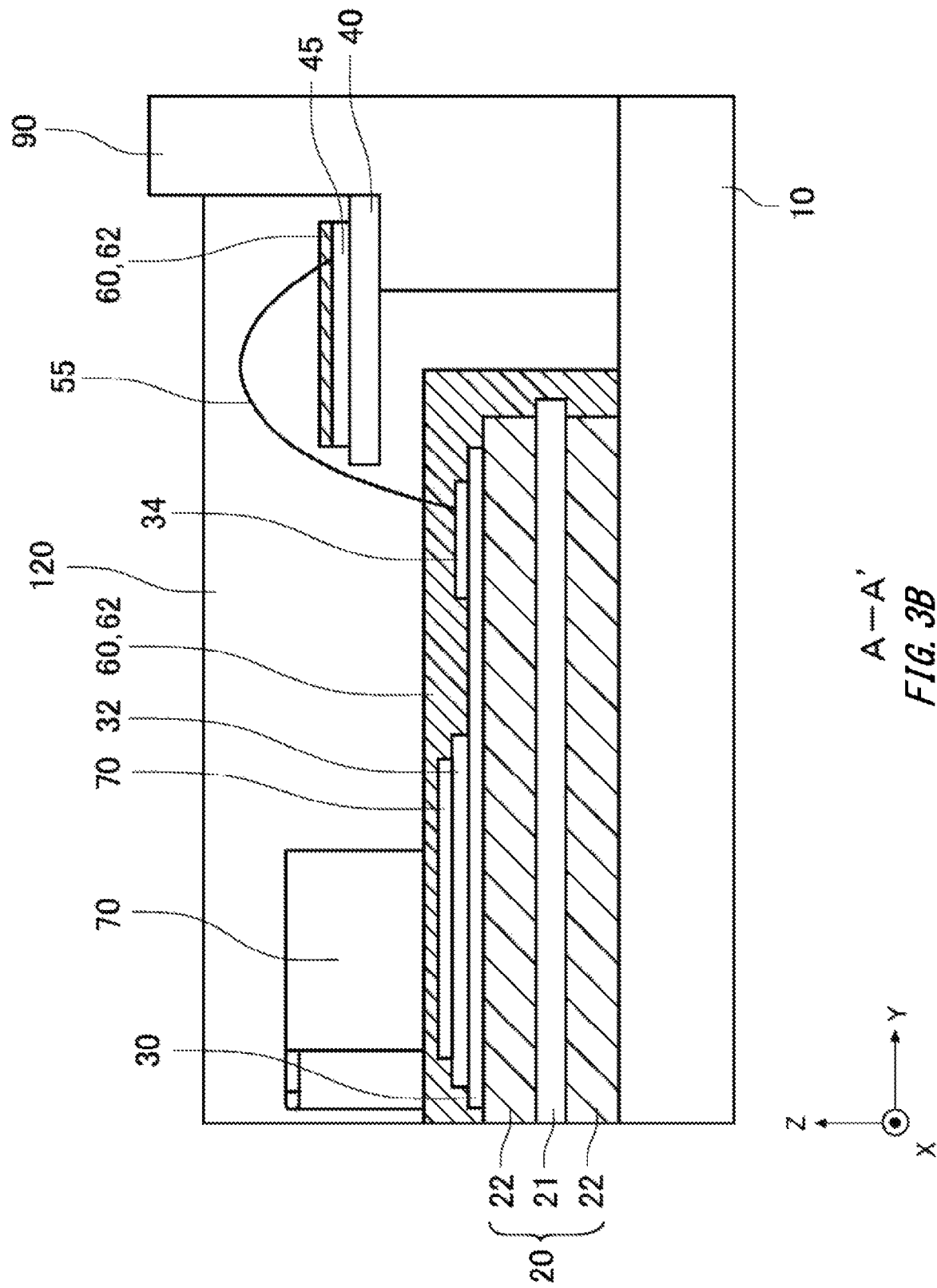
FIG. 3B is an example of a cross-sectional view of the semiconductor assembly 110.

In order to insulate and seal the circuits of the semiconductor assembly 110 and the PCB 40, a sealing resin 120 shown in following FIG. 3B is injected into the housing 90. The sealing resin 120 is provided on the upper surface of the semiconductor chip 30 and an upper surface of the PCB 40. Since the sealing resin 120 is provided in the housing 90, whole side surfaces of the sealing resin 120 are surrounded by the housing 90. The sealing resin 120 may be an insulating thermosetting resin such as an epoxy resin.

In order to improve an adhesion between the sealing resin 120 and the semiconductor assembly 110, the coating layer 60 shown in following FIG. 3C is provided in the semiconductor assembly 110, particularly on the upper surface of the semiconductor chip 30.

As an example, the coating layer 60 may have a thickness of 2 μm or more, and may have a thickness of 3 μm or more. The coating layer 60 includes at least one of polyamide or polyimide. The adhesion between the coating layer 60 and a metal portion on the upper surface of the semiconductor chip 30 is better than the adhesion between the metal portion and the epoxy resin. Furthermore, the coating layer 60 has a good adhesion with the sealing resin 120. Due to a chemical, mechanical and physical combination between the coating layer 60 and the sealing resin 120, the sealing resin 120 is prevented from being peeled off from the semiconductor chip 30 or the like.

The coating layer 60 may be provided on at least a part of an upper surface of the stacked substrate 20. The metal plate 22 is exposed on the upper surface of the stacked substrate 20. By providing the coating layer 60 also on the upper surface of the metal plate 22, the adhesion between a metal portion on the upper surface of the metal plate 22 and the sealing resin 120 also improves. In this way, by providing the coating layer 60 on the upper surface of the semiconductor assembly 110, an impact resistance, a resistance to thermal deformation, or the like in the whole semiconductor module 100 improves such that a reliability of the semiconductor module 100 improves.

The coating layer 60 may be provided by spray application including high performance control dispensing application. Since the semiconductor module 100 has a single-side cooling structure in which an upper surface of the base 10 for semiconductor cooling is exposed, it is possible to enhance the performance of the dispensing application from an upper section of the structure and improve a controllability of an application area in the application of the coating layer 60.

The other means for providing the coating layer 60 includes a method in which the whole semiconductor assembly 110 is immersed in a liquid made of a material of the coating layer 60, or a spin coating is performed. By providing the coating layer 60 at a selective location by the spray application, it is possible to apply a coating material to a desired location including a narrow portion without using an extra material in comparison with the other methods.

Further, the other means for enhancing a combination between the sealing resin 120 and a metal portion of the semiconductor assembly 110 includes means for performing a process such as irradiation of a joint section with a laser to cut a notch, and forming a dimple shape at the joint section to increase a mechanical anchor effect. In the case of the irradiation of the joint section with the laser, a material for the irradiated member is limited.

On the other hand, in the case where the coating layer 60 is provided by the spray application, a material of the joint section between the sealing resin 120 and the metal portion of the semiconductor assembly 110 is not limited. Furthermore, in the case where the coating layer 60 is provided by the spray application, it is easier to implement the process on the narrow portion than in the case where the laser irradiation is used, and it is also easy to adjust an area and a width or the like of the coating region 62.

In providing the coating layer 60, it takes time to dry after the application, and as the extra material is more provided, the drying time is longer. In the case where the coating layer 60 is provided at the selective location, no extra material is used, and thus it is possible to reduce the drying time of the coating layer 60, avoid an occurrence of a drying defect, and decrease a process work time for manufacturing the semiconductor module 100.

Furthermore, in the case where the coating layer 60 includes polyimide or polyamide, it takes a cost in accordance with a weight. By providing the coating layer 60 at the selective location, no extra material is used, and the weight of the coating layer 60 as a whole is reduced. Accordingly, it is possible to reduce the cost to provide the coating layer 60.

As an example of providing the coating layer 60 at the selective location, in the coating region 62 of Example 1, the coating layer 60 is provided to cover a part of the upper surface of the base 10 around the stacked substrate 20 rather than cover a whole surface of the base 10. In the upper surface of the base 10, a portion which is not covered with the coating layer 60 is in contact with the sealing resin 120. In comparison with a case where the coating layer 60 is provided to cover the whole surface of the base 10, it is possible to reduce a use amount of the coating layer 60 without reducing the reliability of the semiconductor module 100.

The coating layer 60 of Example 1 is not provided above the PCB 40. The coating layer 60 may or may not be provided above the main terminal 52. Further, the coating layer 60 of Example 1 is not provided above the base 10 exposed between the plurality of PCBs 40. Note that the coating layer 60 may be provided above the base 10 exposed between the plurality of PCBs 40.

Figure 2A:
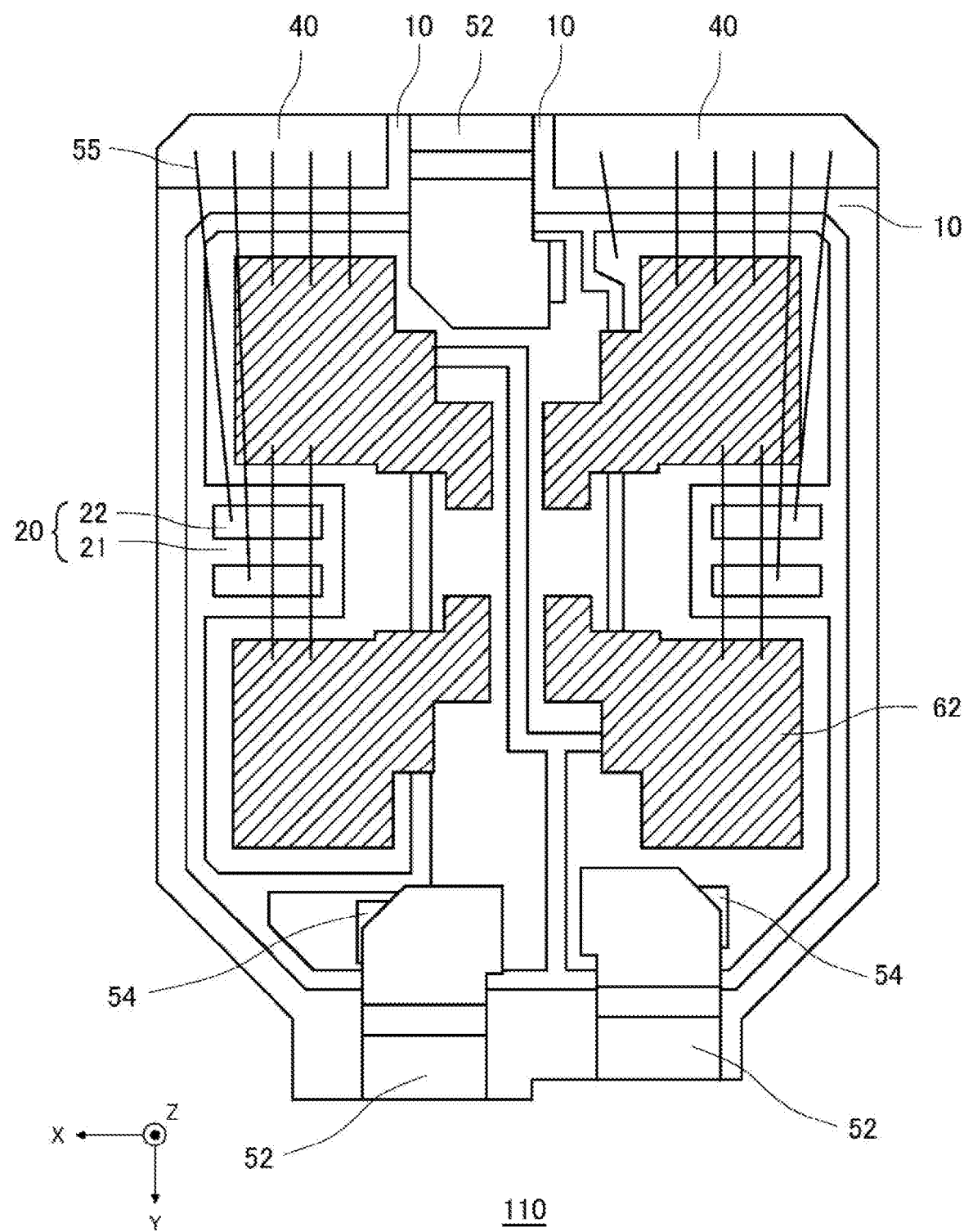
FIG. 2A is an example of a top plan view showing the coating region 62 according to Example 2.

FIG. 2A is an example of a top plan view showing the coating region 62 according to Example 2. A disposition of the coating layer 60 according to Example 2, which is provided above the semiconductor assembly 110, is illustrated. In Example 2, the coating layer 60 is provided on the upper surface of the semiconductor chip 30 and an upper surface of the metal wiring plate 70.

The upper surfaces of the semiconductor chip 30 and the metal wiring plate 70 are formed of various metal materials. By providing the coating layer 60 on the semiconductor chip 30, it is possible to preferentially protect the semiconductor chip 30 having a circuit element. Further, by providing the coating layer 60 on the metal wiring plate 70, it is possible to give the impact resistance to the metal wiring plate 70 having a bending location.

Figure 2B:
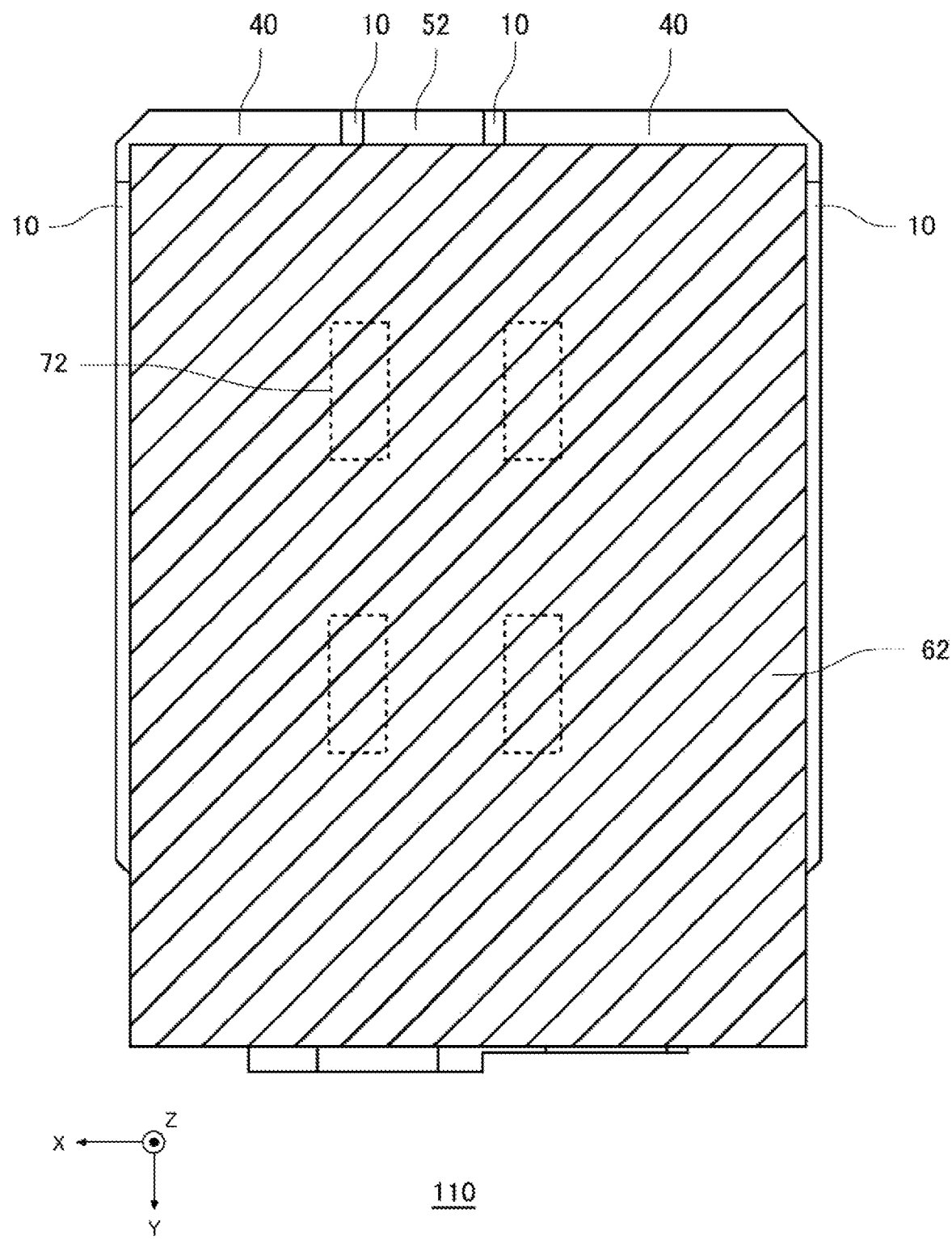
FIG. 2B is an example of a top plan view showing the coating region 62 according to Example 3.

FIG. 2B is an example of a top plan view showing the coating region 62 according to Example 3. A disposition of the coating region 62 according to Example 3 for the coating layer 60 provided above the semiconductor assembly 110 is illustrated.

The coating layer 60 according to Example 3 is provided on the upper surface of the metal wiring plate 70 rather than between the metal wiring plate 70 and the stacked substrate 20. That is, in the metal wiring plate 70, the coating layer 60 is not provided in contact with a lower surface of the link section which bends. A lower surface position 72 of the metal wiring plate 70 in which the coating layer 60 is not provided is indicated by a broken line.

The coating layer 60 is provided on the upper surface of the semiconductor chip 30, and at least one of the upper surface or the lower surface of the metal wiring plate 70. The coating layer 60 may be provided on the upper surface of the metal wiring plate 70 as in Example 3 rather than on the lower surface. On the other hand, the coating layer 60 may be provided on the lower surface of the metal wiring plate 70 rather than on the upper surface. By providing the coating layer 60 by the spray application, the application to the narrow portion which is likely to be provided only on the lower surface of the metal wiring plate 70 is possible.

The coating layer 60 is provided on the whole upper surface of the stacked substrate 20 and at least a part of the upper surface of the PCB 40. The coating layer 60 covers a part of the base 10 around the stacked substrate 20 rather than cover the whole surface of the base 10.

Figure 2C:
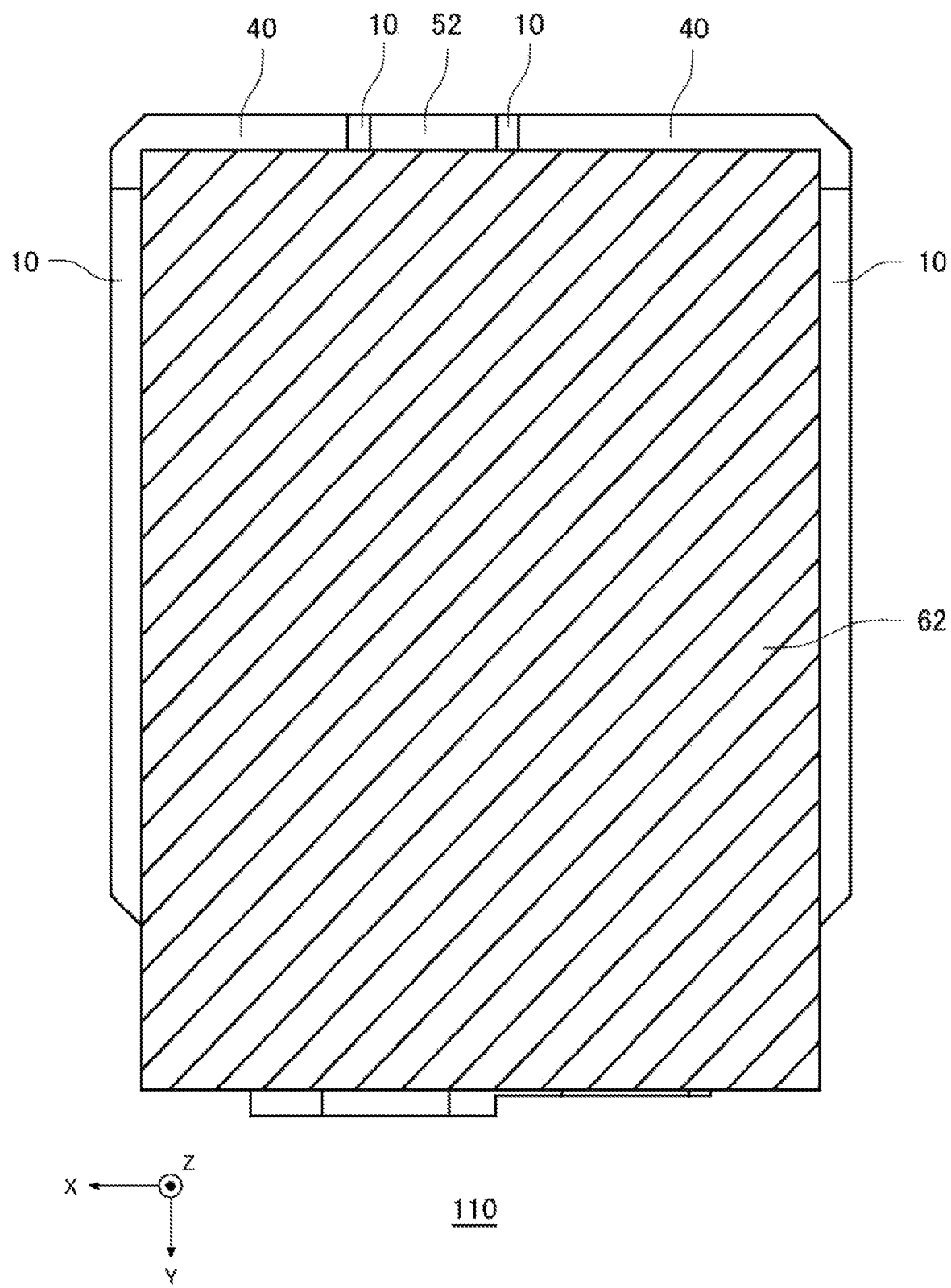
FIG. 2C is an example of a top plan view showing the coating region 62 according to Example 4.

FIG. 2C is an example of a top plan view showing a coating layer 60 according to Example 4. A disposition of the coating region 62 according to Example 4 for the coating layer 60 provided above the semiconductor assembly 110 is illustrated.

The coating layer 60 is provided on a whole surface of the stacked substrate 20 and a part of the PCB 40. The coating layer 60 covers a part of the base 10 around the stacked substrate 20 rather than cover the whole surface of the base 10.

In Example 4, since the coating layer 60 is provided over a wide range, it is possible to secure a sufficient reliability for the semiconductor assembly 110. Further, in comparison with a case where the coating layer 60 is provided on the whole base 10, it is possible to reduce the use amount of the coating layer 60.

FIG. 3A is an example of a top plan view showing a coating layer 60 according to Example 5. A disposition of the coating region 62 according to Example 5 for the coating layer 60 provided above the semiconductor assembly 110 is illustrated.

In Example 5, the coating layer 60 is provided on the whole surface of the stacked substrate 20 and at least a part of the upper surface of the PCB 40. Further, the coating layer 60 of this example is provided on a part of the upper surface of the base 10 around the stacked substrate 20 rather than on the whole upper surface of the base 10. Therefore, it is possible to reduce the use amount of the coating layer 60 and a manufacturing cost of the semiconductor module 100.

On the upper surface of the PCB 40, a connection pad 45 and the wiring layer for an electrical connection to the semiconductor chip 30 are provided. The connection pad 45 may be provided by using a conductive member such as copper, aluminum, or an alloy including at least one of them. The connection pad 45 may be provided apart from the housing 90.

The coating layer 60 is provided on the whole upper surface of the stacked substrate 20 and the upper surface of the PCB 40. The coating layer 60 on the upper surface of the PCB 40 may be provided on an upper surface of the connection pad 45 provided on the upper surface of the PCB 40 rather than on the housing 90 side further than the connection pad 45. By not providing the coating layer 60 between the PCB 40 and the housing 90, for example, in a vicinity of a boundary, in a case where the sealing resin 120 is injected in a sealing manner and then the resin is heated and cured, it is possible to prevent the coating layer 60 from generating air bubbles at an interface of the housing 90 and forming a void.

FIG. 3B is an example of a cross-sectional view of the semiconductor assembly 110. An example of a cross section of FIG. 3A taken along the line A-A' is shown.

The connection pad 45 on the upper surface of the PCB 40 is electrically connected to the control electrode 34 provided on the upper surface of the semiconductor chip 30. In this example, the control electrode 34 and the connection pad 45 are connected by the bonding wire 55. Further, the control electrode 34 and the connection pad 45 are electrically connected by the bonding wire 55 via the metal plate 22 of the stacked substrate 20. The PCB 40 may be provided to cover a part of the stacked substrate 20 as in this example. Furthermore, the PCB 40 may be provided to cover a part of the semiconductor chip 30 provided on the upper surface of the stacked substrate 20. An end portion of the PCB 40 may protrude from the housing 90 toward the stacked substrate 20 in a direction parallel to the upper surface of the base 10.

The coating layer 60 may be provided on the upper surface of the connection pad 45 of the PCB 40. The coating layer 60 may be provided on the upper surface and a side surface of the stacked substrate 20. The coating layer 60 may be provided on the upper surface of the base 10 adjacent to the stacked substrate 20 below the PCB 40 in the top plan view. The coating layer 60 may not be provided on the upper surface of the base 10 adjacent to the housing 90 below the PCB 40 in the top plan view. On the upper surface of the base 10 below the PCB 40, the coating layer 60 may be provided on the stacked substrate 20 side rather than on the housing 90 side. An upper surface of the coating layer 60 provided on the upper surface of the base 10 immediately below the PCB 40 may not be in contact with the lower surface of the PCB 40.

The sealing resin 120 is injected into the housing 90 to cover the upper surfaces of the semiconductor chip 30 and the PCB 40. In a case where the coating layer 60 is provided on the upper surface side and the lower surface side of the PCB 40 as the above described disposition, the sealing resin 120 covers the upper surface of the coating layer 60 provided on the PCB 40. Further, the sealing resin 120 is injected between the coating layer 60 immediately below the PCB 40 and the lower surface of the PCB 40.

That is, the PCB 40 is interposed and fixed between the sealing resin 120 on the upper surface side and the sealing resin 120 inserted on the lower surface side. For the circuit on the upper surface of the PCB 40, the adhesion with the sealing resin 120 gets better by the anchor effect of the coating layer 60. Therefore, a bonding section of the bonding wire 55 is protected, and the reliability such as the impact resistance and the heat resistance can improve in the PCB 40. The sealing resin 120 inserted on the lower surface side of the PCB 40 adheres to the coating layer 60 provided on the stacked substrate 20, the base 10, and the housing 90 so as to support the PCB 40 from below. The inserted sealing resin 120 may be directly in contact with the lower surface of the PCB 40, the coating layer 60 provided on the stacked substrate 20, the base 10, and the housing 90. The eaves-shape end portion of the PCB 40 is supported from above and below by the sealing resin 120.

FIG. 3C is an example of a cross-sectional view of a semiconductor chip 30. An example of a cross section of FIG. 3A taken along the line B-B' is shown. The semiconductor chip 30 is provided on the upper surface of the metal plate 22 of the stacked substrate 20. The semiconductor chip 30 of this example includes the lower main electrode 33 provided on the upper surface of the metal plate 22, and the semiconductor substrate 31 provided above the lower main electrode 33. The upper main electrode 32 and a gate runner 130 are provided on the upper surface of the semiconductor chip 30.

The upper main electrode 32 may be provided by using a conductive member such as a metal layer. The coating layer 60 may be provided on the upper surface of the upper main electrode 32.

The gate runner 130 is provided to surround side surfaces of the upper main electrode 32. The gate runner 130 includes a gate runner conductive section 132 and a passivation film 134. As an example, the gate runner conductive section 132 may include polysilicon. On the upper surface of the semiconductor chip 30, a pressure-resistant structure section such as a guard ring, a RESURF, or a field plate structure may be provided on a further outer periphery of the gate runner 130.

The passivation film 134 is provided, covering the gate runner conductive section 132, on the upper surface of the semiconductor chip 30 in order to give an insulation protection to the gate runner conductive section 132. The passivation film 134 may include polyimide.

As an example, the passivation film 134 is quenched with high heat at a temperature such as 300 degrees Celsius. The quenching is not implemented on the coating layer 60 including at least one of polyimide or polyamide. Depending on a presence or absence of the quenching, the coating layer 60 has mechanical and chemical properties different from the passivation film 134. In this example, the adhesion between the coating layer 60 and the sealing resin 120 is superior to the adhesion between the passivation film 134 and the sealing resin 120.

On the other hand, the coating layer 60 including at least one of polyimide or polyamide is easily chemically cross-linked with the passivation film 134 including polyimide, and the adhesion is good. Accordingly, in a case where the coating layer 60 is provided on an upper surface of the passivation film 134, the adhesion between the passivation film 134 and the sealing resin 120 can be improved.

The coating layer 60 is provided covering the gate runner 130. In this example, the coating layer 60 is provided covering the upper surfaces of the semiconductor chip 30, the passivation film 134, and the upper main electrode 32, respectively.

Figure 4A:
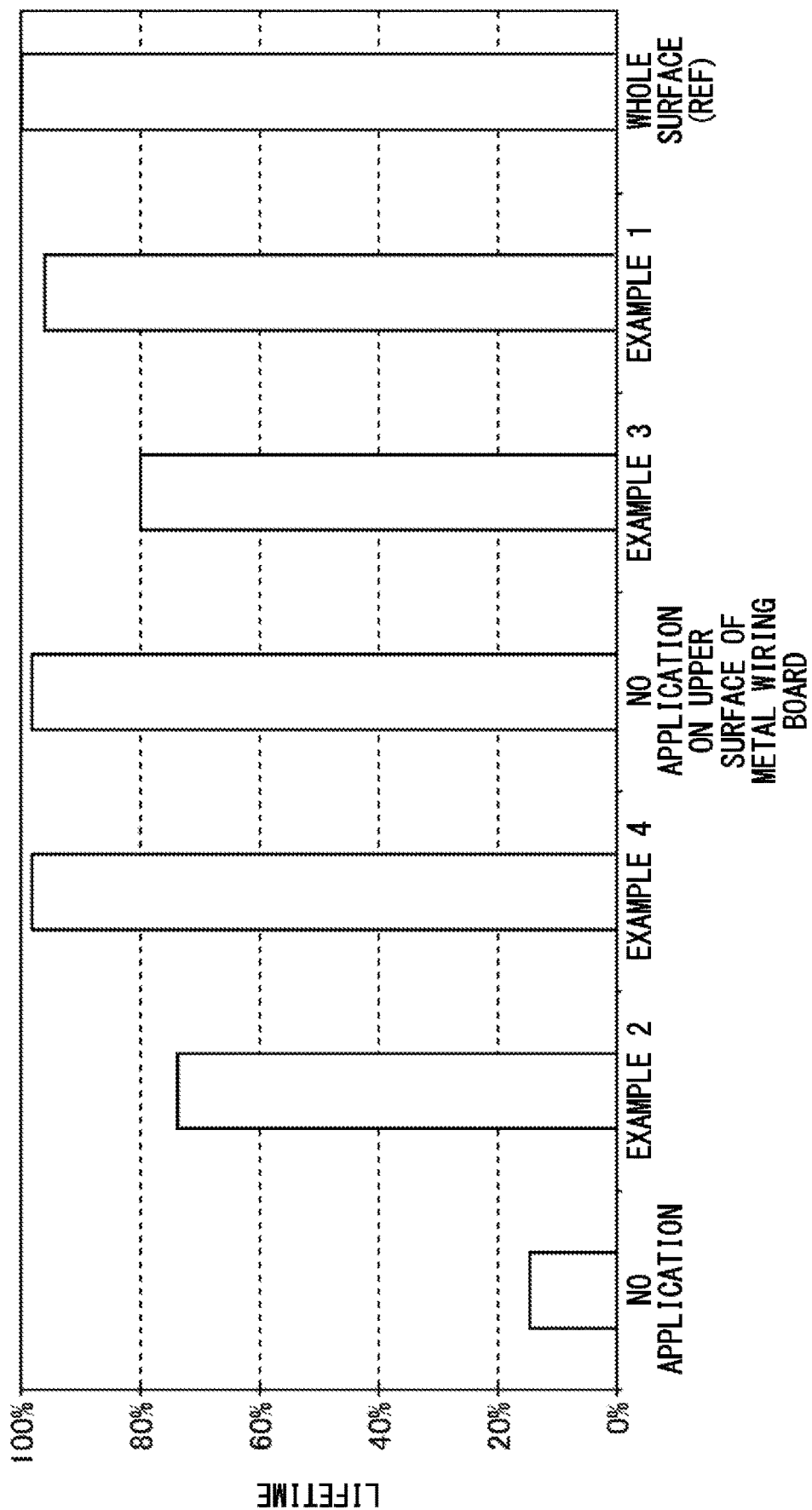
FIG. 4A is a graph showing a relationship between the coating region 62 and a lifetime of the semiconductor module 100.

FIG. 4A is a graph showing a relationship between the coating region 62 and a lifetime of the semiconductor module 100. A horizontal axis shows each Example, and a vertical axis shows a degree that the lifetime can be maintained when a case where the coating layer 60 is provided on the whole surface of the semiconductor assembly 110 is set to be 100%. This graph can be obtained from a failure cycle analysis in a case where a current of a predetermined magnitude is applied to the semiconductor module 100 in order to apply a predetermined temperature.

An example in which the coating layer 60 is not provided at all on the semiconductor assembly 110 is described on a leftmost side of the horizontal axis. In the case where the coating layer 60 is not provided at all, the lifetime of the semiconductor module 100 is greatly reduced.

In Example 2, the coating layer 60 is provided only on the semiconductor chip 30 and the metal wiring plate 70. Even in the case of Example 2, the lifetime is longer in comparison with the case where the coating layer 60 is not provided at all. Note that the lifetime is shorter in comparison with the example in which the coating layer 60 is provided on the upper surface of the stacked substrate 20 as in each of the other Examples.

In Example 4, the coating layer 60 is provided on the upper surfaces of the stacked substrate 20 and the PCB 40, and is disposed not to be provided on the whole surface of the base 10. In Example 4, the lifetime can be sufficiently maintained in comparison with the case where the coating layer 60 is applied to the whole surface of the semiconductor assembly 110.

Example 3 is different from Example 4 in that the coating layer 60 is provided on the lower surface of the metal wiring plate 70 rather than on the upper surface. The graph also shows the example in which the coating layer 60 is provided on the lower surface of the metal wiring plate 70 rather than on the upper surface. The disposition of the coating layer 60 on the metal wiring plate 70 has an influence on the lifetime more greatly on the lower surface than on the upper surface. Note that the influence on the lifetime depending on whether or not the coating layer 60 is provided on the upper surface of the main terminal 52 is smaller than the influence depending on whether or not the coating layer 60 is provided on the upper surface or the lower surface of the metal wiring plate 70.

In Example 1, the coating layer 60 is not provided on the upper surface of the PCB 40. The influence on the lifetime depending on whether or not the coating layer 60 is provided on the upper surface of the PCB 40 is greater than the influence depending on whether or not the coating layer 60 is provided on the upper surface of the metal wiring plate 70.

Figure 4B:
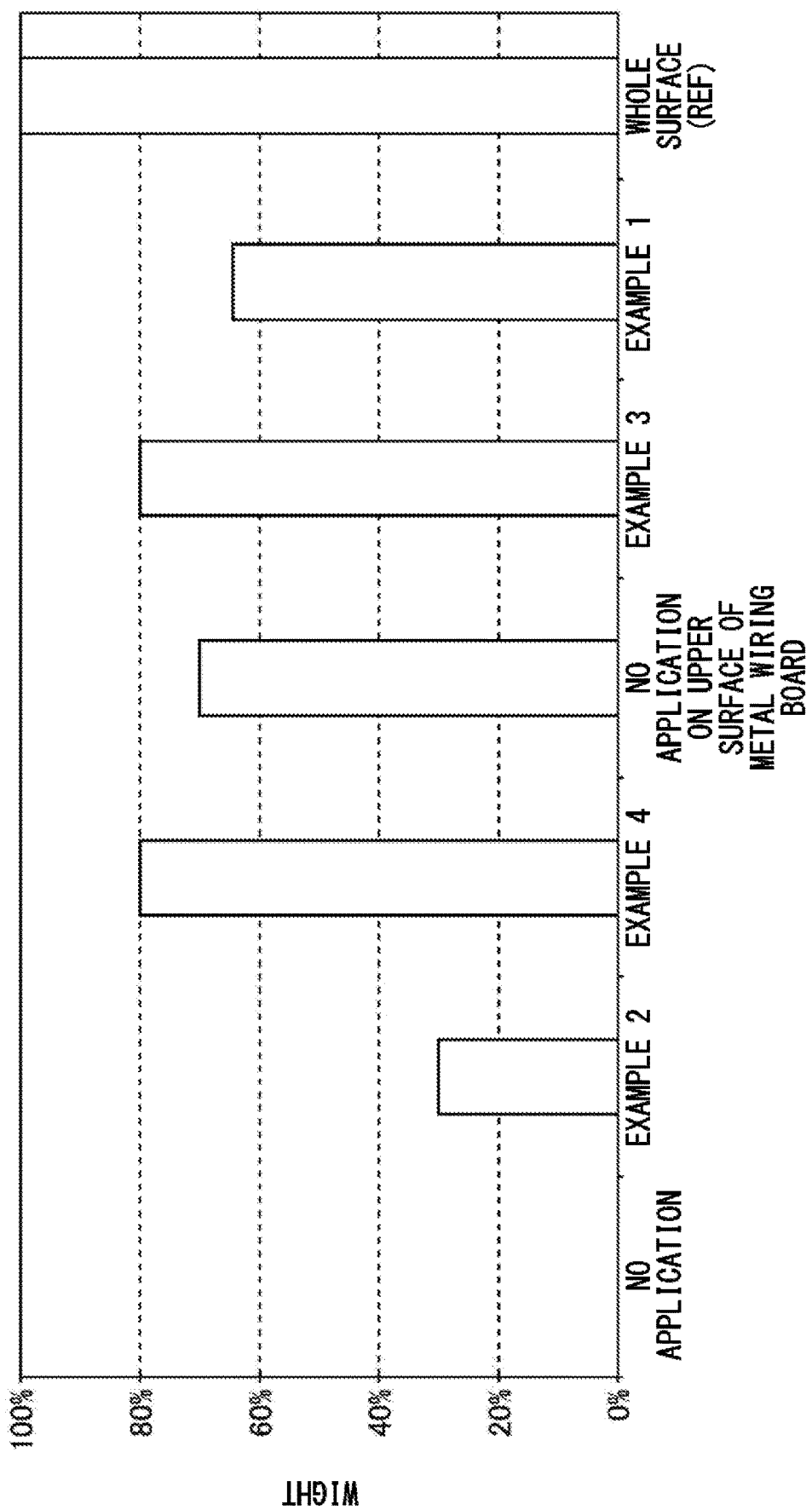
FIG. 4B is a graph showing a relationship between the coating region 62 and a weight of the semiconductor module 100.

FIG. 4B is a graph showing a relationship between the coating region 62 and a weight of the semiconductor module 100. The horizontal axis shows each Example, and the vertical axis shows a degree that the weight can be reduced when a case where the coating layer 60 is provided on the whole surface of the semiconductor assembly 110 is set to be 100%.

In Example 2, since the coating layer 60 is provided only on the semiconductor chip 30 and the metal wiring plate 70, the weight can be significantly reduced. In a case where a length of the desired lifetime in Example 2 is sufficient, the cost can be significantly reduced by applying the disposition of the coating layer 60 in Example 2.

In Example 4, the lifetime is sufficiently maintained in comparison with the case where the coating layer 60 is applied to the whole surface. On the other hand, a total weight of the coating layer 60 in Example 4 is reduced on the order of several tens of percent. Example 4 is suitable for a case where it is desired to reduce the weight of the semiconductor module 100 without greatly reducing the lifetime thereof.

In Example 3, in comparison with Example 4, the weight is not expected to be greatly reduced, while the lifetime is reduced. Accordingly, in a case where the coating layer 60 is removed from at least one of the upper surface or the lower surface of the metal wiring plate 70, the upper surface is advantageous in terms of maintaining the lifetime and reducing the weight.

In Example 1, the weight is reduced by not providing the coating layer 60 on the PCB 40. Note that the lifetime of the semiconductor module 100 is also shortened at a certain rate in Example 1.

As described above, each Example shows the influence on the lifetime of the semiconductor module 100 and the total weight of the coating layer 60. By providing the coating layer 60 by the spray application, it is possible to switch to a desired Example in accordance with the lifetime of the semiconductor module 100 and cost requirements.

Figure 5:
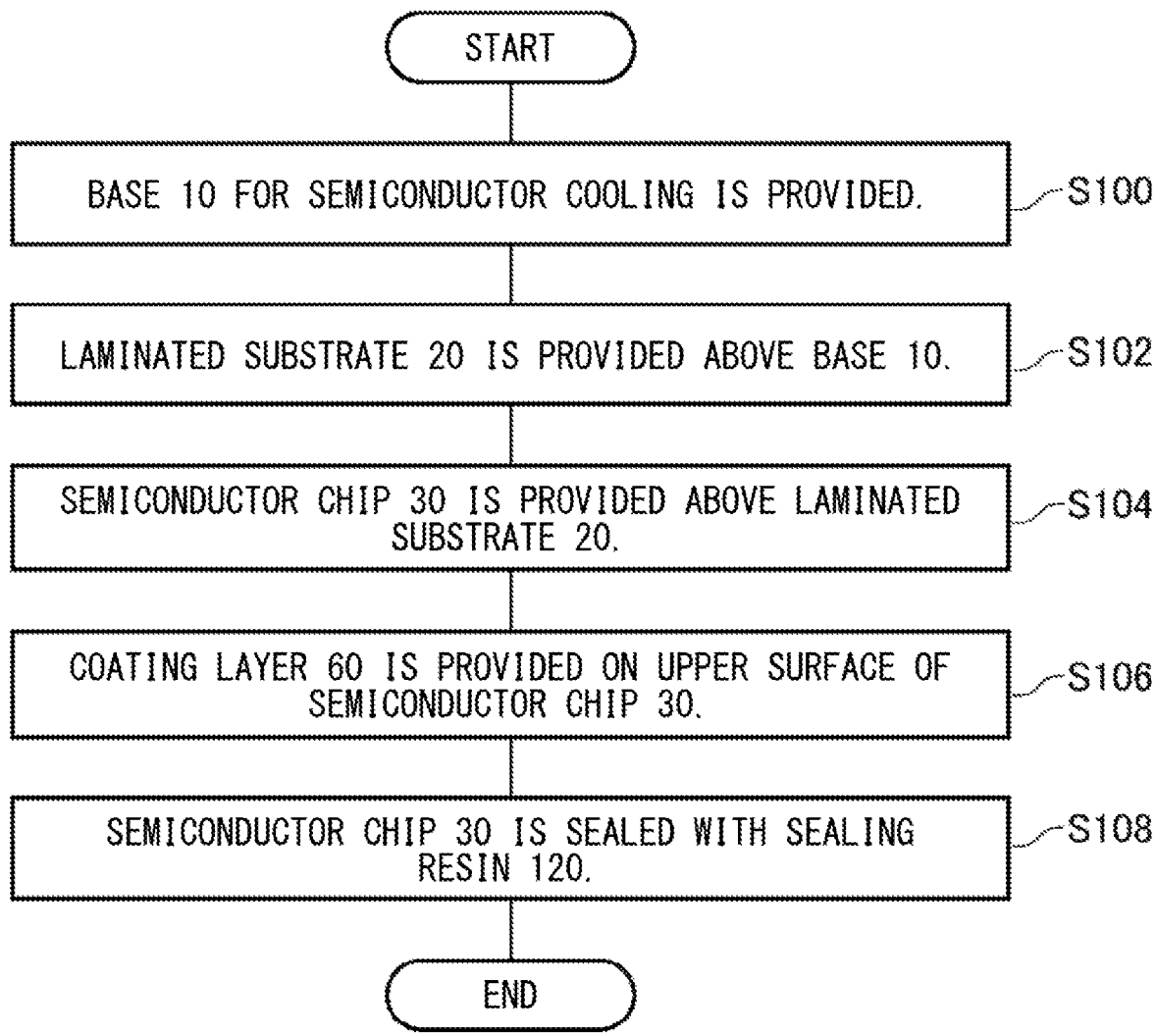
FIG. 5 shows an example of a flowchart of manufacturing the semiconductor module 100.

FIG. 5 shows an example of a flowchart of manufacturing the semiconductor module 100. In this example, the semiconductor module 100 is manufactured by steps S100 to S108.

In step S100, the base 10 for semiconductor cooling is provided. The base 10 for semiconductor cooling may be a metal plate with a high heat dissipation and may be integrally formed with the cooler. In a case where the base 10 is integrally formed with the cooler, the base 10 becomes the upper surface of the cooler.

In step S102, the stacked substrate 20 is provided above the base 10. As the stacked substrate 20, the stacked substrate 20 of the DCB substrate, the AMB substrate, or the like may be provided.

In step S104, the semiconductor chip 30 is provided above the stacked substrate 20. The semiconductor chip 30 may include the switching element.

In step S106, the coating layer 60 is provided on the upper surface of the semiconductor chip 30. In S106, the whole upper surface of the stacked substrate 20 may be covered with the coating layer 60. The base 10 may be partially covered by the coating layer 60 rather than be wholly covered. The providing of the coating layer 60 may include applying the coating layer 60 by the spray application. By providing the coating layer 60 by the spray application, it is possible to provide the coating layer 60 also on the narrow portion of the semiconductor module 100.

In step S108, the semiconductor chip 30 is sealed with the sealing resin 120. The sealing resin 120 may be injected into the housing 90 which is provided to surround the semiconductor assembly 110. In the upper surface of the base 10, a location where the coating layer 60 is not provided may be in contact with the sealing resin 120. The semiconductor module 100 is provided by the above process.

Figure 6:
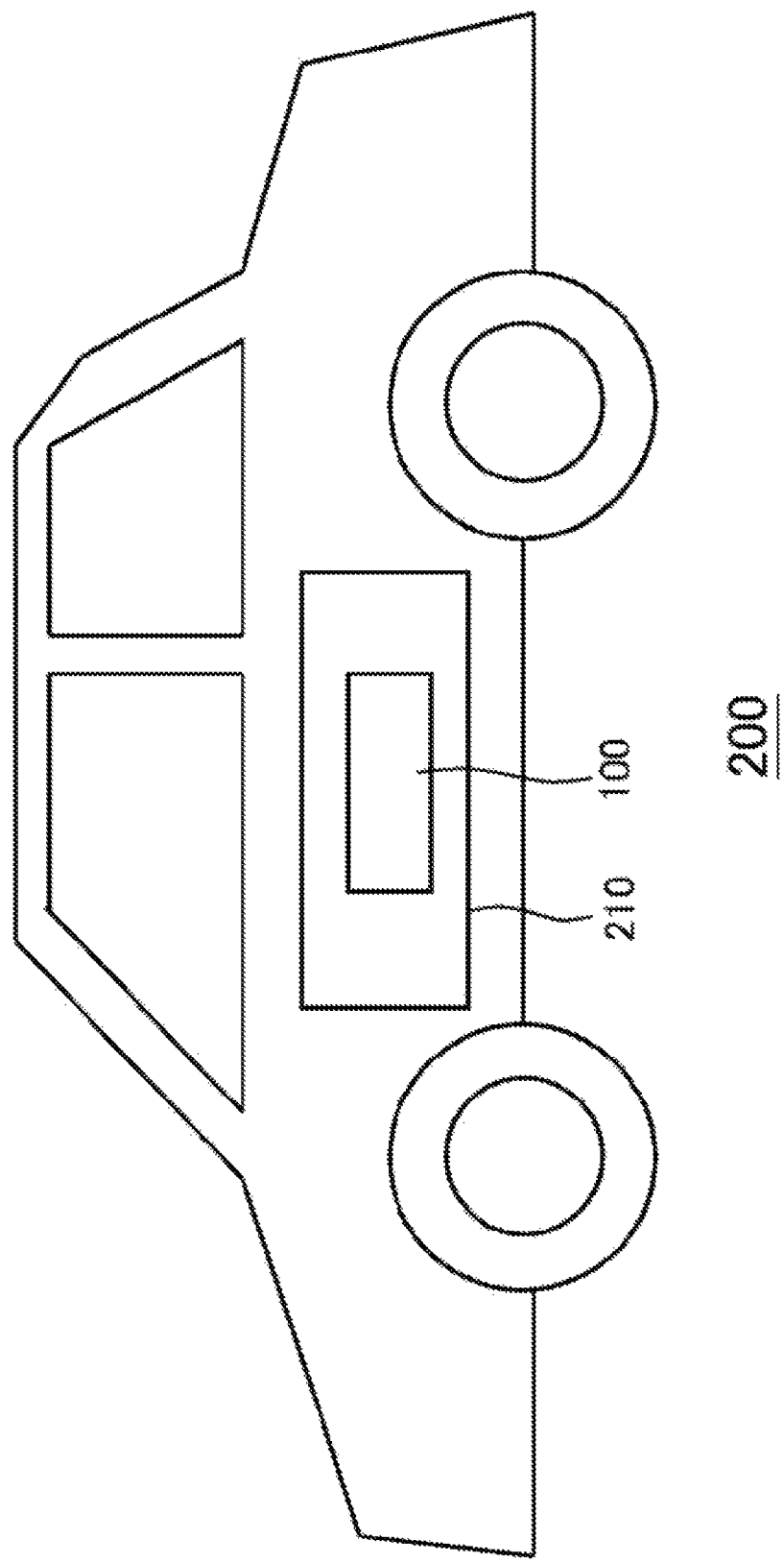
FIG. 6 is a schematic diagram of a vehicle 200 according to examples.

FIG. 6 is a schematic diagram of a vehicle 200 according to Examples. The vehicle 200 is a vehicle in which propulsion is generated at least partially by using electric power. As an example, the vehicle 200 is an electric vehicle which generates all propulsion by electric power drive equipment including a motor, or a hybrid vehicle which uses the electric power drive equipment including the motor together with an internal combustion engine driven by fuel such as gasoline.

The vehicle 200 includes a control apparatus 210 (an external apparatus) which controls the electric power drive equipment including the motor. The control apparatus 210 is provided with the semiconductor module 100. The semiconductor module 100 may control the electric power supplied to the electric power drive equipment.

Figure 7:
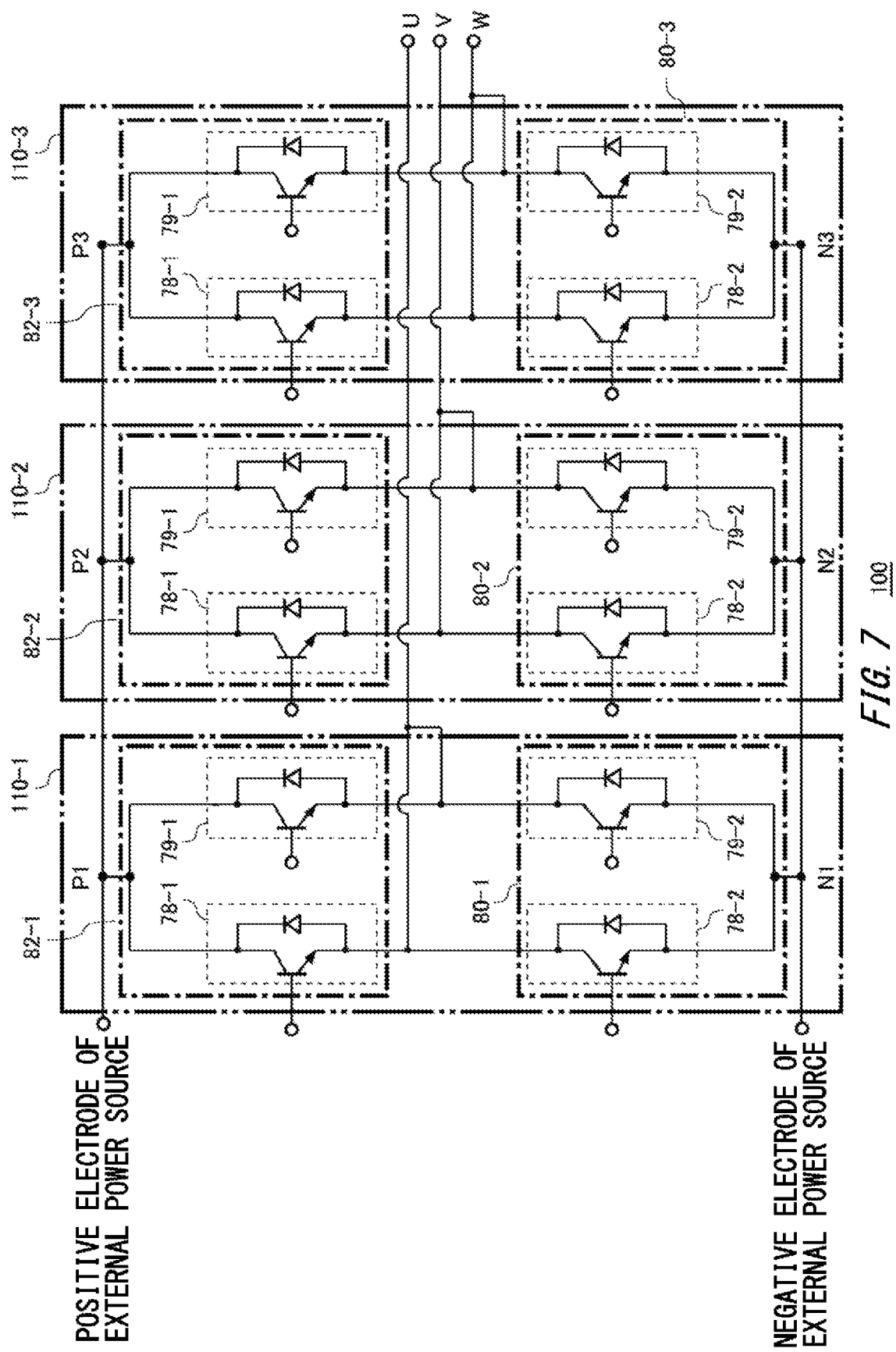
FIG. 7 is a main circuit diagram of the semiconductor module 100 according to examples.

FIG. 7 is a main circuit diagram of the semiconductor module 100 according to Examples. The semiconductor module 100 may be a part of a vehicle-mounted unit which drives a vehicle motor. The semiconductor module 100 may function as a three-phase AC inverter circuit having output terminals U, V, W. A circuit of the semiconductor module 100 shown below may be mounted by the three semiconductor assemblies 110.

In the semiconductor assembly 110, pairs of first semiconductor chips 78 are connected in series, pairs of second semiconductor chip 79 are connected in series, and each first semiconductor chip 78 and each second semiconductor 79 are connected in parallel. In the semiconductor chips of a semiconductor assembly 110-1, a semiconductor assembly 110-2, and a semiconductor assembly 110-3, parts which include each first semiconductor chip 78-2 and each second semiconductor chip 79-2 which are connected in parallel may constitute a lower arm portion 80-1, a lower arm portion 80-2, and a lower arm portion 80-3. On the other hand, in the semiconductor chips of the semiconductor assembly 110-1, the semiconductor assembly 110-2, and the semiconductor assembly 110-3, parts which include each first semiconductor chip 78-1 and each second semiconductor chip 79-1 which are connected in parallel may constitute an upper arm portion 82-1, an upper arm portion 82-2 and an upper arm portion 82-3.

Further, a set of the lower arm portion 80-1 and the upper arm portion 82-1 included in the semiconductor assembly 110-1 may constitute a leg. A set of the lower arm portion 80-2 and the upper arm portion 82-2 included in the semiconductor assembly 110-2 may constitute the leg. A set of the lower arm portion 80-3 and the upper arm portion 82-3 included in the semiconductor assembly 110-3 may constitute the leg.

In the lower arm portion 80-1, the emitter electrodes of the first semiconductor chip 78-2 and the second semiconductor chip 79-2 may be electrically connected to an input terminal N1, and the collector electrodes of the first semiconductor chip 78-2 and the second semiconductor chip 79-2 may be electrically connected to the output terminal U, respectively. In the upper arm portion 82-1, the emitter electrodes of the first semiconductor chip 78-1 and the second semiconductor chip 79-1 may be electrically connected to the output terminal U, and the collector electrodes of the first semiconductor chip 78-1 and the second semiconductor chip 79-1 may be electrically connected to an input terminal P1, respectively.

In the lower arm portion 80-2, the emitter electrodes of the first semiconductor chip 78-2 and the second semiconductor chip 79-2 may be electrically connected to an input terminal N2, and the collector electrodes of the first semiconductor chip 78-2 and the second semiconductor chip 79-2 may be electrically connected to the output terminal V, respectively. In the upper arm portion 82-2, the emitter electrodes of the first semiconductor chip 78-1 and the second semiconductor chip 79-1 may be electrically connected to the output terminal V, and the collector electrodes of the first semiconductor chip 78-1 and the second semiconductor chip 79-1 may be electrically connected to an input terminal P2, respectively.

In the lower arm portion 80-3, the emitter electrodes of the first semiconductor chip 78-2 and the second semiconductor chip 79-2 may be electrically connected to an input terminal N3, and the collector electrodes of the first semiconductor chip 78-2 and the second semiconductor chip 79-2 may be electrically connected to the output terminal W, respectively. In the upper arm portion 82-3, the emitter electrodes of the first semiconductor chip 78-1 and the second semiconductor chip 79-1 may be electrically connected to the output terminal W, and the collector electrodes of the first semiconductor chip 78-1 and the second semiconductor chip 79-1 may be electrically connected to an input terminal P3, respectively.

The lower arm portions 80-1 to 80-3 and the upper arm portions 82-1 to 82-3 may be alternately switched by a signal input to control electrode pads of the first semiconductor chip 78 and the second semiconductor chip 79. In this example, the first semiconductor chip 78 and the second semiconductor chip 79 generate the heat during the switching.

The input terminals P1, P2, P3 may be connected to a positive electrode of an external power source. The input terminals N1, N2, N3 may be connected to a negative electrode of the external power source. The input terminals P1, P2, P3 may be electrically connected to each other. The input terminals N1, N2, N3 may be electrically connected to each other. Each of the output terminals U, V, W may be connected to a load.

In the semiconductor module 100, each of the first semiconductor chip 78 and the second semiconductor chip 79 may be an RC-IGBT semiconductor chip. In the RC-IGBT semiconductor chip, the IGBT and the Free Wheeling Diode (FWD) are integrally formed. In the RC-IGBT semiconductor chip, the IGBT and FWD may be connected in antiparallel. Each of the first semiconductor chip 78 and the second semiconductor chip 79 may include a combination of a transistor such as the MOSFET or the IGBT and a diode.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A method of manufacturing a semiconductor module, the method comprising:
    providing a base for semiconductor cooling;
    providing a stacked substrate above the base;
    providing a semiconductor chip above the stacked substrate;
    providing a coating layer on an upper surface of the semiconductor chip; and
    sealing the semiconductor chip with a sealing resin, wherein
    the base is in contact with the sealing resin, and
    wherein the coating layer is provided between the semiconductor chip and the sealing resin and is adapted to prevent the sealing resin from being peeled off from the semiconductor chip.

2. The method of manufacturing a semiconductor module according to claim 1, wherein
    the providing of the coating layer includes applying the coating layer by spray application.

3. The method of manufacturing a semiconductor module according to claim 1, wherein the sealing resin is insulating.

4. A semiconductor module comprising:
a base for semiconductor cooling;
a stacked substrate provided above the base;
a semiconductor chip provided above the stacked substrate;
a coating layer provided on an upper surface of the semiconductor chip; and
a sealing resin sealing the semiconductor chip, wherein the base is in contact with the sealing resin, and
wherein the coating layer is provided between the semiconductor chip and the sealing resin and is adapted to prevent the sealing resin from being peeled off from the semiconductor chip.

5. The semiconductor module according to claim 4, wherein the stacked substrate comprises:
a first metal layer;
a second metal layer; and
an insulation plate interposed between the first metal layer and the second metal layer.

6. The semiconductor module according to claim 4, wherein
the semiconductor chip has an upper main electrode of the semiconductor chip, and
the coating layer is provided in contact with an upper surface of the upper main electrode.

7. The semiconductor module according to claim 4, wherein
the coating layer is provided on at least a part of an upper surface of the stacked substrate.

8. The semiconductor module according to claim 4, wherein
the coating layer includes at least one of polyimide or polyamide.

9. The semiconductor module according to claim 4, wherein the sealing resin is insulating.

10. A vehicle comprising the semiconductor module according to claim 4.

11. The semiconductor module according to claim 4, further comprising:
a metal wiring plate provided on the upper surface of the semiconductor chip, wherein
the coating layer is provided on the upper surface of the semiconductor chip, and at least one of an upper surface or a lower surface of the metal wiring plate.

12. The semiconductor module according to claim 11, wherein
the coating layer is provided on the lower surface of the metal wiring plate rather than on the upper surface of the metal wiring plate.

13. The semiconductor module according to claim 11, wherein
the coating layer is provided on the upper surface of the metal wiring plate rather than on the lower surface of the metal wiring plate.

* * * * *